US011476363B2

(12) United States Patent
Verma et al.

(10) Patent No.: US 11,476,363 B2
(45) Date of Patent: Oct. 18, 2022

(54) SEMICONDUCTOR DEVICE AND METHOD OF FABRICATING THE SAME

(71) Applicant: UNITED MICROELECTRONICS CORP., Hsin-Chu (TW)

(72) Inventors: Purakh Raj Verma, Singapore (SG); Ching-Yang Wen, Pingtung County (TW); Li Wang, Singapore (SG); Kai Cheng, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 107 days.

(21) Appl. No.: 17/117,080

(22) Filed: Dec. 9, 2020

(65) Prior Publication Data

US 2021/0098624 A1   Apr. 1, 2021

Related U.S. Application Data

(63) Continuation-in-part of application No. 16/408,415, filed on May 9, 2019, now Pat. No. 10,923,599.

(30) Foreign Application Priority Data

Apr. 10, 2019   (CN) .......................... 201910284570.0

(51) Int. Cl.
*H01L 29/78*   (2006.01)
*H01L 29/06*   (2006.01)
(Continued)

(52) U.S. Cl.
CPC ...... *H01L 29/7838* (2013.01); *H01L 29/0649* (2013.01); *H01L 29/401* (2013.01);
(Continued)

(58) Field of Classification Search
None
See application file for complete search history.

(56) References Cited

U.S. PATENT DOCUMENTS

| 5,795,810 A | 8/1998 | Houston | |
|---|---|---|---|
| 5,869,867 A | * 2/1999 | Takeuchi | .......... H01L 29/41733 |
| | | | 257/E21.538 |

(Continued)

FOREIGN PATENT DOCUMENTS

| CN | 105826174 A | 8/2016 |
|---|---|---|
| CN | 111816710 A | 10/2020 |

(Continued)

OTHER PUBLICATIONS

Verma, the specification, including the claims, and drawings in the U.S. Appl. No. 16/170,067, filed Oct. 25, 2018.

*Primary Examiner* — Bilkis Jahan
(74) *Attorney, Agent, or Firm* — Winston Hsu

(57) ABSTRACT

A semiconductor device includes a buried dielectric layer, a first gate structure, a second gate structure, a first source/drain region, a second source/drain region, a trench, and a contact layer. The first gate structure is disposed on a front-side of the buried dielectric layer, and the second gate structure is disposed on a backside of the buried dielectric layer. The first source/drain region and a second source/drain region are disposed between the first gate structure and the second gate structure. The trench is formed in the buried dielectric layer, and the contact layer is disposed in the trench and electrically coupled to the second source/drain region, where the contact structure and the second gate structure are formed of the same material.

12 Claims, 6 Drawing Sheets

(51) Int. Cl.
*H01L 29/66* (2006.01)
*H01L 29/40* (2006.01)
*H01L 29/417* (2006.01)

(52) U.S. Cl.
CPC .. *H01L 29/41725* (2013.01); *H01L 29/66484* (2013.01); *H01L 29/7831* (2013.01)

(56) References Cited

U.S. PATENT DOCUMENTS

| | | | |
|---|---|---|---|
| 8,026,521 | B1 | 9/2011 | Or-Bach |
| 8,575,699 | B2 * | 11/2013 | Chan ................ H01L 29/78648 |
| | | | 257/349 |
| 8,878,278 | B2 | 11/2014 | Alsmeier |
| 9,105,577 | B2 | 8/2015 | Cheng |
| 9,385,140 | B1 | 7/2016 | McMullan |
| 9,455,187 | B1 | 9/2016 | Gambino |
| 9,780,210 | B1 * | 10/2017 | Goktepeli ............. H01L 29/165 |
| 9,997,606 | B2 | 6/2018 | Cheng |
| 10,205,018 | B1 * | 2/2019 | Li ...................... H01L 29/6656 |
| 10,923,599 | B2 | 2/2021 | Verma |
| 2003/0119292 | A1 | 6/2003 | Lee |
| 2006/0197111 | A1 | 9/2006 | Matsuzawa |
| 2009/0212362 | A1 | 8/2009 | Cheng |
| 2012/0175594 | A1 | 7/2012 | Chen |
| 2015/0270393 | A1 * | 9/2015 | Kumar ............. H01L 29/78603 |
| | | | 327/437 |
| 2015/0311245 | A1 | 10/2015 | Yamazaki |
| 2015/0370949 | A1 | 12/2015 | Moroz |
| 2017/0125452 | A1 | 5/2017 | Ide |
| 2017/0207244 | A1 | 7/2017 | Kato |
| 2018/0019185 | A1 | 1/2018 | Costa |
| 2018/0269229 | A1 | 9/2018 | Or-Bach |
| 2019/0027560 | A1 | 1/2019 | Andrieu |
| 2019/0131456 | A1 | 5/2019 | Wu |
| 2019/0288119 | A1 * | 9/2019 | Yamada ............ H01L 29/66484 |
| 2020/0328311 | A1 | 10/2020 | Verma |
| 2021/0125921 | A1 | 4/2021 | Verma |
| 2021/0134720 | A1 | 5/2021 | Peng |
| 2021/0225768 | A1 | 7/2021 | Peng |

FOREIGN PATENT DOCUMENTS

| | | |
|---|---|---|
| EP | 0 545 694 A2 | 6/1993 |
| EP | 0 545 694 A3 | 10/1993 |
| EP | 3 723 124 A2 | 10/2020 |
| JP | 2018-181890 A | 11/2018 |
| WO | 2016/114941 A1 | 7/2016 |
| WO | 2018/118210 A1 | 6/2018 |

* cited by examiner

SEMICONDUCTOR DEVICE AND METHOD OF FABRICATING THE SAME

CROSS REFERENCE TO RELATED APPLICATIONS

This application is a continuation-in-part of U.S. application Ser. No. 16/408,415, filed on May 9, 2019, the disclosure of which is incorporated herein by reference in its entirety.

BACKGROUND OF THE INVENTION

1. Field of the Invention

The invention relates generally to a semiconductor device used in radio frequency (RF) switches, and more particular to a semiconductor device using a silicon-on-insulator substrate and a fabricating method thereof.

2. Description of the Prior Art

Semiconductor-on-insulator (SOI) substrates are widely used as substrates for radio frequency (RF) devices. For example, field effect transistors are employed as a switching device for RF signals in analog and RF applications. The RF devices fabricated on the RF SOI substrate are generally applied in wireless communication, smart phones, etc. The reason SOI substrates are widely employed for such applications is that parasitic coupling between devices through the substrate is reduced due to the low dielectric constant of a buried insulator layer.

An SOI substrate includes an insulator layer sandwiched between a silicon substrate and a semiconductor material layer. In an RF circuit, the silicon layer allows active components to be wired together using any standard IC technology.

With the advent of 5G cellular mobile communication, the off-capacitance ($C_{off}$) and the parasitic capacitance between the source/drain ($C_{ds}$) of RF devices are not low enough. Therefore, there is a need to find a way to further reduce the Coff and Cds of RF devices.

SUMMARY OF THE INVENTION

In view of this, the present invention provides a semiconductor device with a double gate structure to solve the above problems.

According to an embodiment of the invention, a semiconductor device comprises a buried dielectric layer, a first gate structure, a second gate structure, a first source/drain region, a second source/drain region, a first contact structure and a second contact structure. The first gate structure and the second gate structure disposed respectively in the front-side and back side of the dielectric layer, the first source/drain region and the second source/drain region are disposed between the first gate structure and the second gate structures, the first contact structure is disposed in the front-side of the dielectric layer and electrically coupled to the first source/drain region, and the second contact structure is disposed in the backside of the dielectric layer and electrically coupled to the second source/drain region.

According to one embodiment of the invention, a semiconductor device comprises a buried dielectric layer, a first gate structure, a second gate structure, a first source/drain region, a second source/drain region, a trench, and a contact layer. The first gate structure is disposed on a front-side of the buried dielectric layer, and the second gate structure is disposed on a backside of the buried dielectric layer. The first source/drain region and a second source/drain region are disposed between the first gate structure and the second gate structure. The trench penetrates the buried dielectric layer and exposes a backside of the second source/drain region. The contact layer is disposed in the trench and electrically coupled to the second source/drain region, where the contact structure and the second gate structure are formed of the same material.

According to one embodiment of the invention, a method of fabricating a semiconductor device is provided and includes the following steps. First, a semiconductor structure is provided, and the semiconductor structure includes a buried dielectric layer, a first gate structure disposed on a front-side of the buried dielectric layer, and a first source/drain region and a second source/drain region disposed between the buried dielectric layer and the first gate structure. Then, a trench is formed in the buried dielectric layer. Afterwards, a conductive layer is formed on the buried dielectric layer and in the trench. Finally, the conductive layer is patterned.

These and other objectives of the present invention will no doubt become obvious to those of ordinary skill in the art after reading the following detailed description of the preferred embodiment that is illustrated in the various figures and drawings.

DETAILED DESCRIPTION

The present disclosure may be understood by reference to the following detailed description, taken in conjunction with the drawings as described below. It is noted that, for purposes of illustrative clarity and being easily understood by the readers, various drawings of this disclosure show a portion of the device, and certain elements in various drawings may not be drawn to scale. In addition, the number and dimension of each device shown in drawings are only illustrative and are not intended to limit the scope of the present disclosure.

The terms "comprises," "comprising," "includes" and/or "including" are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

When an element or layer is referred to as being "coupled to" or "connected to" another element or layer, it may be directly coupled or connected to the other element or layer, or intervening elements or layers may be presented. In contrast, when an element is referred to as being "directly coupled to" or "directly connected to" another element or layer, there are no intervening elements or layers presented.

It should be noted that the technical features in different embodiments described in the following may be replaced, recombined, or mixed with one another to constitute another embodiment without departing from the spirit of the present disclosure.

Figure 1:
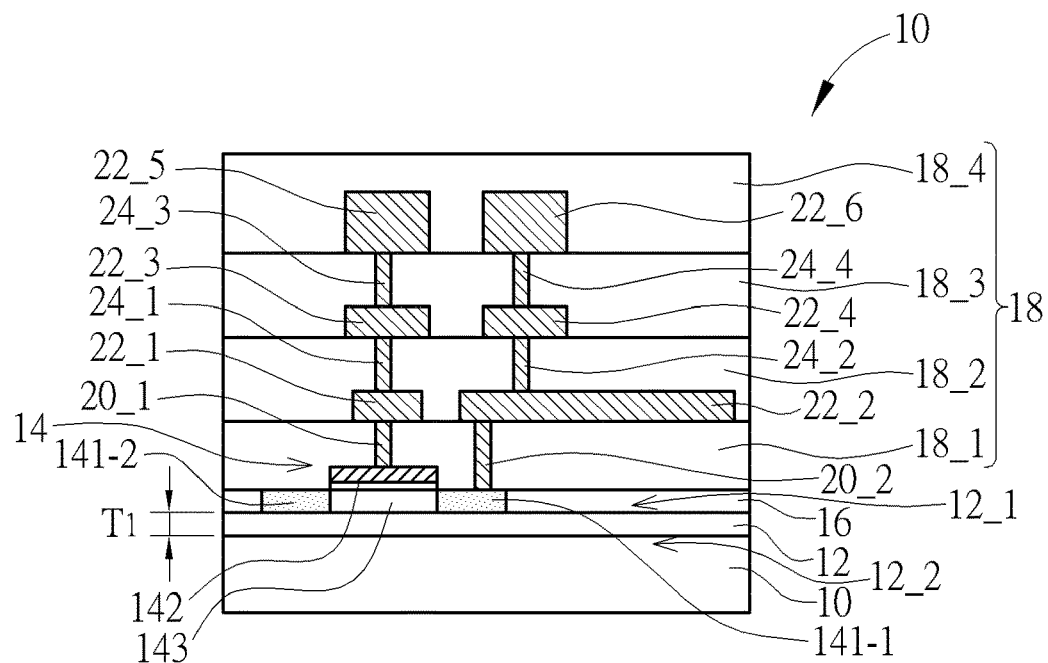
FIG. 1 is a cross-sectional diagram of the semiconductor device at a specific manufacturing processing stage according to a first embodiment of the invention.

FIG. 1 to FIG. 5 are schematic diagrams of a method for fabricating a semiconductor device according to one embodiment of the present invention. FIG. 1 is a cross-sectional diagram of a semiconductor device at a specific fabrication stage according to one embodiment of the present invention. Referring to FIG. 1, at this time, the semiconductor device 100 includes semiconductor substrate 10, buried dielectric layer 12 disposed on the semiconductor substrate 10, a transistor element 14 disposed on the buried dielectric layer 12, insulation structure 16 surrounding the transistor element 14, interlayer dielectric 18 covering the transistor element 14, and contact structures 20_1 and 20_2, conductive interconnection 22_1, 22_2 . . . 22_6, and contact plugs 24_1, 24_2 . . . 24_4 respectively disposed in the interlayer dielectric 18.

The transistor element 14 mentioned above is mainly made on the silicon-on-insulator substrate, so that the transistor element 14 may be arranged on the front-side 12-1 of the buried insulator 12. For example, prior to the fabrication of the transistor element 14, an buried insulator 12 and a semiconductor layer (not shown) are sequentially sacked on the semiconductor substrate 10 such that the semiconductor substrate 10 is located at the backside 12_2 of the buried insulator 12 and the semiconductor layer is at the front-side 12_1 of buried insulator 12. During the process of fabricating the transistor element 14, such as deposition, photolithography, etching, ion implantation, etc., portions of the semiconductor layer may be replaced with the insulation structure 16, such as shallow trench isolation (STI), and a first source/drain region 141-1, a second source/drain region 141-2 and channel region 143 are also fabricated in the semiconductor layer. In addition, a gate structure 142 (or first gate structure) may be disposed on the channel region 143, and the gate structure 142 may include a gate dielectric layer and a gate electrode sequentially stacked from bottom to top.

The buried insulation layer 12 may be a buried oxide layer (BOX), the thickness T1 of the buried insulation layer 12 may be between 250 Angstroms and 1000 Angstroms, and the thickness of the carrier channel region 143 may be between 20 and 100 Angstroms, especially between 50 and 90 Angstrom. 12. By forming the buried insulating layer and setting the thickness of the carrier channel region 143 in a certain range, the corresponding transistor element 14 may become a partially depleted SOI transistor or a fully depleted SOI transistor.

In order to transmit electronic signals, the gate structure 142 and the first source/drain region of the transistor element 14 may be electrically coupled to contact structures 20_1 and 20_2, and further electrically coupled to conductive interconnections 22_5 and 22_6. Furthermore, the contact structure 20_1 may be sequentially electrically coupled to conductive interconnection 22_1, contact plug 24_1, conductive interconnection 22_3, contact plug 24_3 and conductive interconnection 22_5. The contact structure 20_2 may be sequentially electrically coupled to conductive interconnection 22_2, contact plug 24_2, conductive interconnection 22_4, contact plug 24_4 and conductive interconnection 22_6. Besides, the contact structures 20_1 and 20_2 may be disposed in the interlayer dielectric 18_2. The conductive interconnection 22_1 and 22_2 and contact plug 24_1 and 24_2 may be disposed in the interlayer dielectric 18_2. The conductive interconnection 22_3 and 22_4 and contact plug 24_3 and 24_4 may be disposed in the interlayer dielectric 18_3. The conductive interconnection 22_5 and 22_6 may be disposed in the interlayer dielectric 18_4. The above contact structure, conductive interconnections and contact plugs may be single-layered or multi-layered structures respectively, and the material composition of which may include titanium (Ti), tantalum (Ta), aluminum (Al), tungsten (W) or copper (Cu), but not limited thereto.

Figure 2:
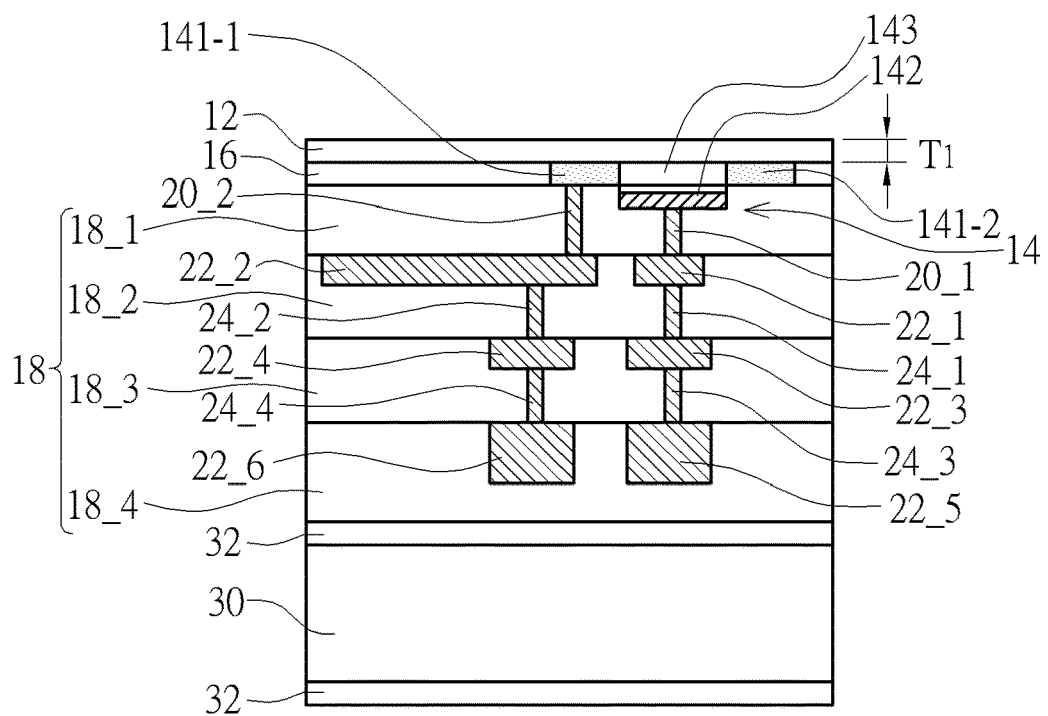
FIG. 2 is a cross-sectional diagram of a semiconductor device bonded to another substrate according to a first embodiment of the invention.

FIG. 2 is a cross-sectional diagram of a semiconductor device bonded to another substrate and the semiconductor substrate being removed afterwards according to one embodiment of the invention. After obtaining the semiconductor device 100 shown in FIG. 1, referring to FIG. 2, the wafer bonding process may be used to bond the topmost interlayer dielectric 18_3 to another carrier substrate 30. The carrier substrate 30 is made of insulating materials with high resistivity (>$10^9$ ohms·m), insulation materials may be glass, quartz or silicon nitride, etc., but not limited thereto. In addition, in order to increase the adhesion between the interlayer dielectric 18_3 and the carrier substrate 30, an intermediate layer 32 may be further disposed on the surface of the carrier substrate 30. By providing a carrier substrate 30 with high resistivity, the internal or external signals of the semiconductor device 100 may not easily penetrate the carrier substrate 30, thus avoiding mutual interference of the signals. After the bonding process, a suitable etching process may be used to remove the semiconductor substrate used to support the buried insulating layer 12.

As shown in FIG. 2, in a case where the buried insulating layer 12 and the semiconductor substrate are respectively made of silicon oxide and single crystal silicone, by applying an etching process with high etching selectivity (such as etch rate for silicon oxide:etch rate for single crystal silicon=1:100 to 1:300), the semiconductor substrate may be completely removed without removing the buried insulating layer 12. In other words, after the etching process, the thickness T1 of the buried insulation layer 12 will not be reduced or only reduced slightly.

Figure 3:
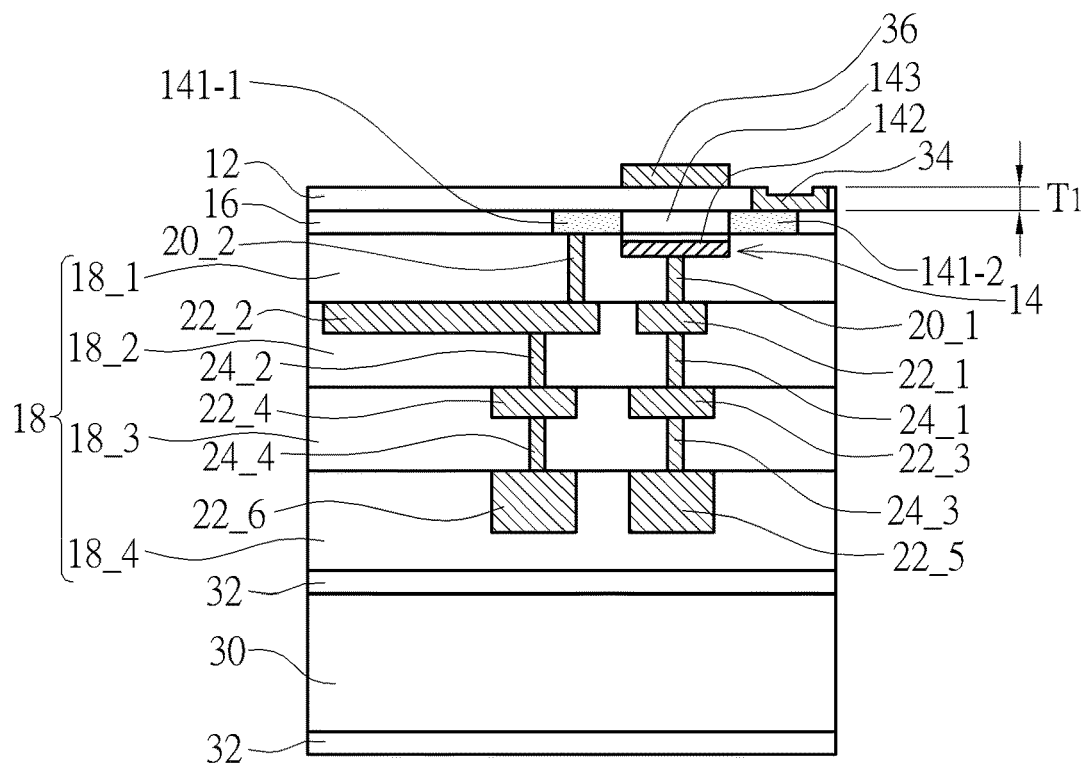
FIG. 3 is a cross-sectional diagram of the semiconductor device after forming a back gate structure according to a first embodiment of the invention.

FIG. 3 is a cross-sectional diagram of a semiconductor device according to one embodiment of the invention after forming a back gate structure. After the step shown in the embodiment of FIG. 2, the fabrication process of photolithography and etching is then used to etch part of the buried insulation layer 12 to form a trench therein, so that at least a part of the second source/drain region 141-2 is exposed from the buried insulation layer 12 or from the bottom of the trench. After that, a conductive layer (not shown), such as titanium or titanium nitride, is conformally deposited on the surface of the buried insulation layer 12 and in the trench, so that the conductive layer can directly contact the second source/drain region 141-2. Additional lithography and etching processes may be performed to remove portions of the conductive layer, thereby obtaining a contact layer 34 and a gate structure 36 (also called a second gate structure) laterally spaced apart from the contact layer 34. The contact layer 34 may be electrically coupled to the second source/drain region 141-2, and there is an ohmic contact between the contact layer 34 and the second source/drain region 141-2. The position of gate structure 36 may correspond to the carrier channel region 143 on the other side of the buried insulating layer 12, and the gate structure 36 may be used as the back gate electrode of the transistor element 14. Besides, since the gate structure 36 is formed on the buried insulation layer 12 and the contact layer 34 is filled into the trench of the buried insulation layer 12, a top surface of the gate structure may be higher than a top surface of the contact layer.

Figure 4:
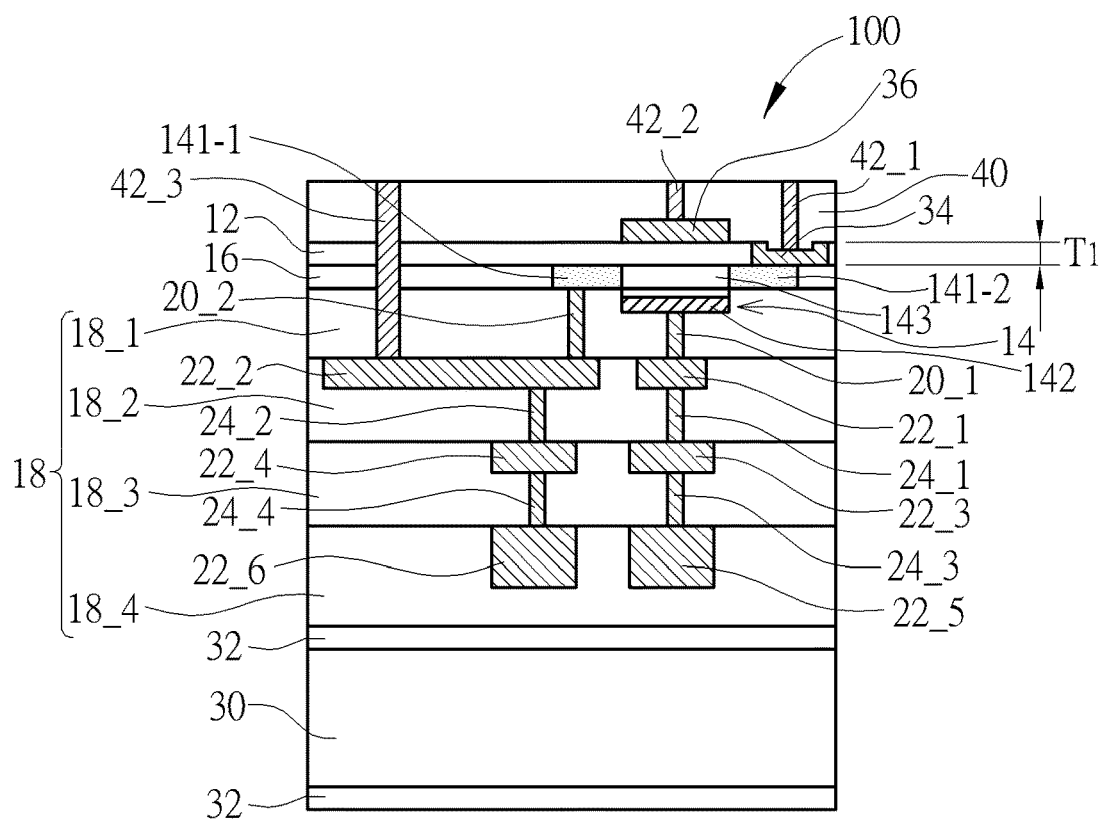
FIG. 4 is a cross-sectional diagram of a semiconductor device after forming a contact structure according to a first embodiment of the invention.

FIG. 4 is a cross-sectional diagram of a semiconductor device according to one embodiment of the invention after forming a contact structure. The interlayer dielectric 40 (also called a backside interlayer dielectric) can then be deposited to cover the buried insulating layer 12, the contact layer 34 and the gate structure 36 concurrently. After that, photolithography and etching processes may be used to form openings in the interlayer dielectric 40 and interlayer dielectric 18_1 to expose the contact layer 34, the gate structure 36 and the conductive interconnection 22_2. Afterwards, deposition and polishing processes may be conducted to fill up the openings with conductive materials so as to form contact structures 42_1, and 42_2 and through-hole plug 42_3 (also called through-hole contact plug). Contact structures 42_1 and 42_2 and through-hole plug 42_3 may be electrically coupled to the contact layer 34, the gate structure 36 and the conductive interconnection 22_2, respectively. Furthermore, the through-hole plug 42_3 may penetrate the buried insulation layer 12 and insulation structure 16, and may be further electrically coupled to the first source/drain region 141-1 through a conductive interconnection 22_2.

Figure 5:
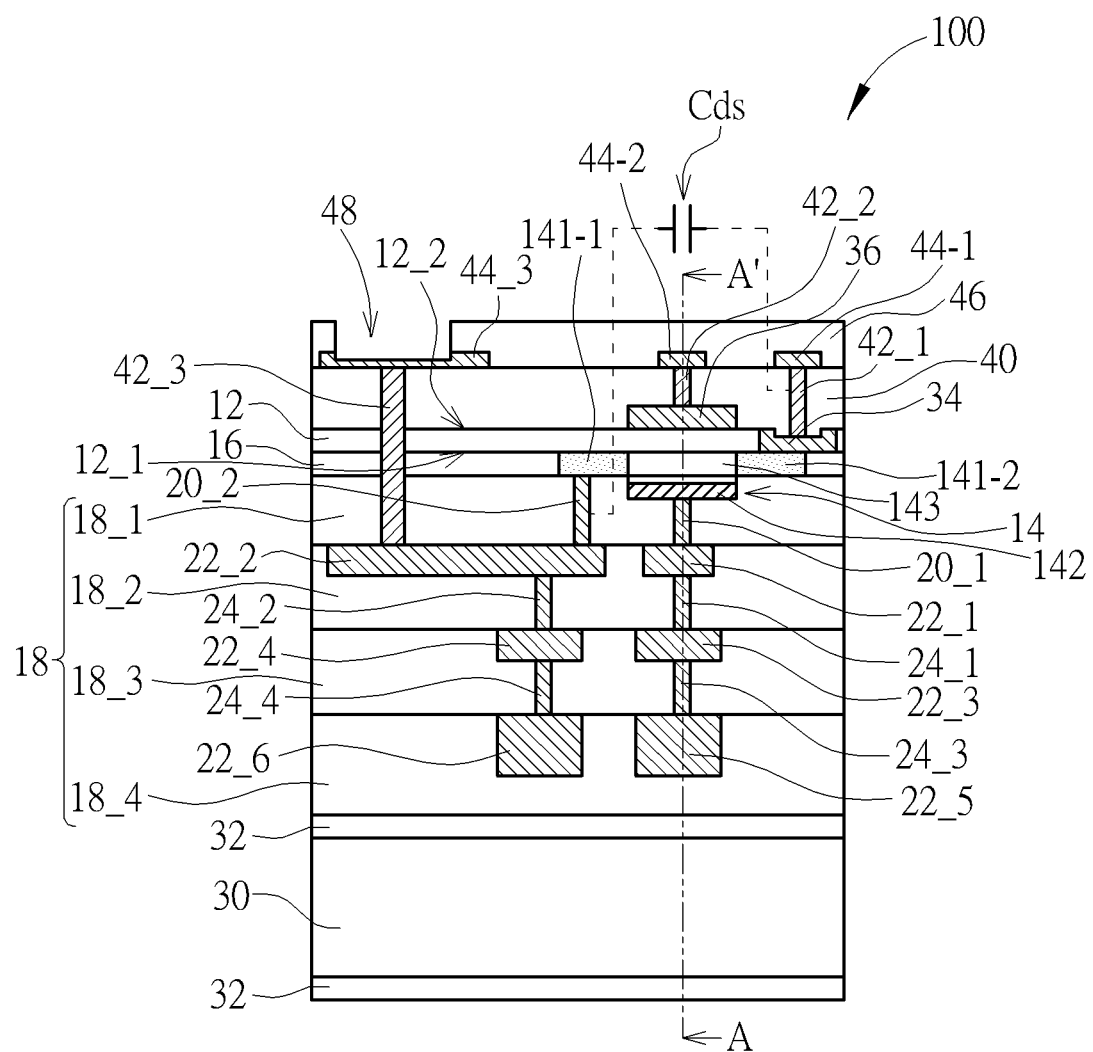
FIG. 5 is a cross-sectional diagram of the semiconductor device after a conductive pad is formed according to a first embodiment of the invention.

FIG. 5 is a cross-sectional diagram of a semiconductor device according to one embodiment of the invention after a conductive pad is formed. A deposition process can then be performed to deposit conductive material on the surface of the interlayer dielectric 40 (not shown). After that, photolithographic, etching and other manufacturing processes may be used to etch conductive materials, and conductive interconnections 44_1 and 44_2 and conductive pad 44_3 are formed on the surface of the interlayer dielectric 40. The conductive interconnections and conductive pad may be regarded as conductive patterned features. Subsequently, the dielectric layer 46 may be further deposited to cover the conductive interconnections 44_1 and 44_2 and the conductive pad 44_3, and additional photolithographic and etching processes may be used to form the opening 48 in the dielectric layer 46 so as to expose part of the conductive pad 44_3. In the subsequent fabrication process, another conductive bump (not shown) may be formed on the conductive pad 44_3, so that the semiconductor device 100 may be electrically coupled to the external device through the conductive bump.

According to the semiconductor device shown in FIG. 5, where the transistor element 14 and gate structure 36 may be used as components of the RF switch elements. Because the RF switch element usually operates in a range of high frequency, such as in a range of 3 kHz to 300 GHz, its off capacitance should be as low as possible. According to one embodiment of the invention, the gate structure 142 and the gate structure 36 may constitute a double gate structure, which may be used as the front gate and a back gate of carrier channel region 143 respectively. By disposing the double gate structure, even if the thickness of the carrier channel region 143 is between 20 and 100 Angstroms, especially between 50 to 90 Angstroms, it can still be controlled by the back gate, so that the carrier channel region 143 may be able to be completely depleted by providing suitable voltage to the back gate so as to reduce the off-capacitance ($C_{off}$).

In addition, according to embodiments of the invention, the contact structure 42_1 and the contact structure 20_2 are electrically coupled to the first source/drain region 141-1 and the second source/drain region 141-2, respectively, and the contact structure 42_1 and the contact structure 20_2 are at the front-side 12-1 and the backside 12-2 of the buried dielectric layer 12, respectively. Compared with the case where both the contact structure 42_1 and the contact structure 20_2 are on the same side, the distance between the contact structure 42_1 and the contact structure 20_2 according to the embodiment of the present invention may be effectively increased, thereby reducing the capacitance between the drain/source (Cds) and thereby improve the phenomenon of signal distortion.

Figure 6:
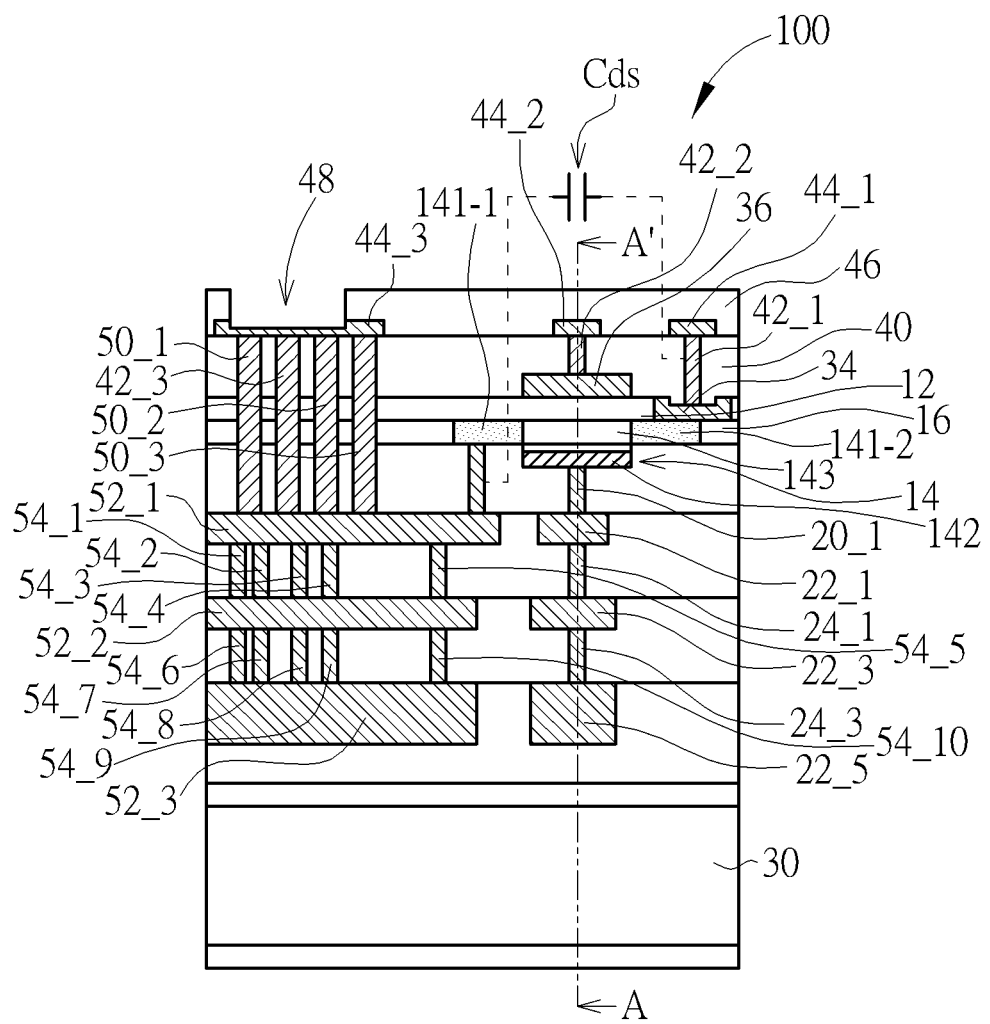
FIG. 6 is a cross-sectional diagram of a semiconductor device according to a second embodiment of the invention.

FIG. 6 is a cross-sectional diagram of a semiconductor device according to a second embodiment of the invention. The main difference between the semiconductor devices shown in FIG. 6 and FIG. 5 is that the semiconductor device shown in FIG. 6 includes not only the through-hole plug 42_3 electrically couple to the conductive pad 44_3 but also several through-hole plugs 50_1, 50_2 and 50_3, conductive interconnections 52_1, 52_4 and 52_8, contact plugs 54_1, 54_2 . . . 54_10 coupled to the conductive pad 44_3. By disposing through-hole plugs 50_1, 50_2 and 50_3, conductive interconnections 52_1, 52_4 and 52_8, and contact plugs 54_1, 54_2 . . . 54_10, the transistor element 14 within the RF switch element may be coupled to a power transistor element or high voltage power supply and thereby reducing the overall transmission resistance.

Figure 7:
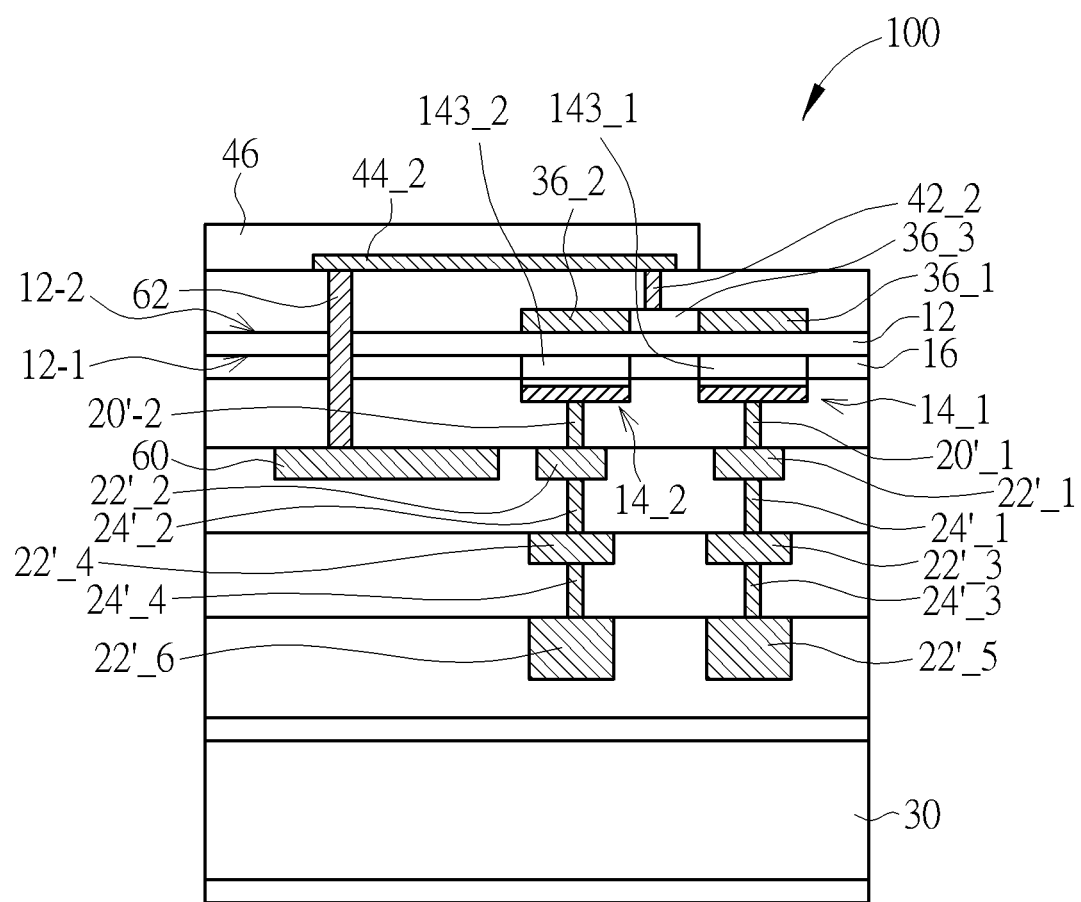
FIG. 7 is a cross-sectional diagram of a semiconductor device according to a third embodiment of the invention.

FIG. 7 is a cross-section diagram of the semiconductor device taken along line A-A' of FIG. 5 or FIG. 6 according to a third embodiment of the present invention. At least two transistor elements 14_1 and 14_2 are disposed at the front-side 12-1 of the buried dielectric layer 12, and the transistor element 14_1 and 14_2 may be surrounded by an insulation structure 16. Gate electrode of the transistor element 14_1 may be sequentially electrically connected to the contact structure 20_1, a conductive interconnection 22'_1, a contact plug 24'_1, conductive interconnection 22'_3, contact plug 24'_3 and a conductive interconnection 22'_5. Gate electrode of the transistor element 14_2 may be sequentially electrically connected to the contact structure 20'_2, a conductive interconnection 22'_2, a contact plug 24'

2, a conductive interconnection 22' 4, a contact plug 24' 4 and a conductive interconnection 22' 6. In addition, the gate structures 36_1 and 36_2 are disposed corresponding to the transistor element 14_1 and transistor element 14_2, respectively, so that a carrier channel region 143_1 and a carrier channel region 143_2 may be controlled by the front gate and back gate, respectively. In addition, the gate structure 36_1 and the gate structure 36_2 are electrically coupled to each other through the conductive layer 36_3, and gate structure 36_1 and gate structure 36_2 have different work function in order to provide different electrical switching performance. Specifically, during the process of fabricating the gate structure 36_1 and the gate structure 36_2, ion implantation process may be conducted to adjust the work function of the gate structure 36_1 and the gate structure 36_2. The above-mentioned contact structures, conductive interconnection and the contact plugs may be single-layered structure or multi-layered structure, respectively, and the material composition may include titanium (Ti), tantalum (Ta), aluminum (Al), tungsten (W) or copper (Cu), but not limited thereto.

In addition, an interconnection may be used to electrically couple the gate structure 36_1 and gate structure 36_2 to a conductive interconnection 60 at the front-side 12-1 of the buried dielectric layer 12. Specifically, the gate structure 36_1 and the gate structure 36_2 may be electrically coupled to the conductive interconnection 60 sequentially through the contact plug 42_2, the conductive interconnection 44_2 and through-hole plug 62. The through-hole plug 62 penetrates the buried dielectric layer 12 and the insulation structure 16. By electrically coupling the gate structure 36_1 and the gate structure 36_2 to the conductive interconnection 60 at the front-side 12-1 of the buried dielectric layer 12, the structure of the conductive interconnection 44_2 on the surface of the interlayer dielectric 40 may be simplified so as to better meet the manufacturing process requirements.

Figure 8:
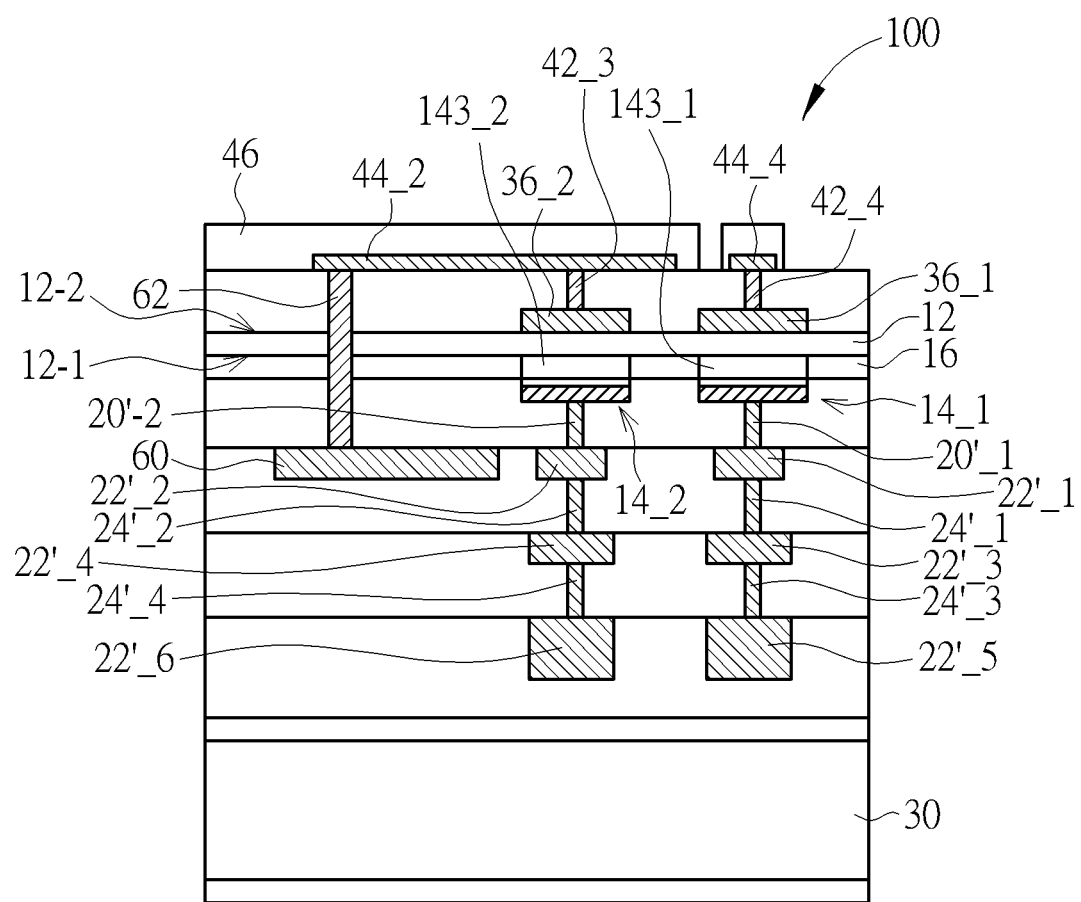
FIG. 8 is a cross-sectional diagram of a semiconductor device according to a fourth embodiment of the present invention.

In addition, FIG. 8 is a cross-sectional diagram of the semiconductor device taken along line A-A' of FIG. 5 or FIG. 6 according to a fourth embodiment of the invention. The main difference between FIG. 8 and FIG. 7 is that the gate structure 36_1 and the gate structure 36_2 in FIG. 8 are separated from each other, and only the gate structure 36_2 is electrically coupled to the conductive interconnection 60 at the front-side 12-1 of the buried dielectric layer 12, while the gate structure 36_1 is electrically coupled to the conductive interconnection 44_4 (also called conductive patterned feature) on the surface of the interlayer dielectric 40.

According to above embodiments, by disposing at least one back gate structure and disposing the contact structures of the source/drain respectively on different sides of the buried dielectric layer, the off-capacitance ($C_{off}$) may be effectively reduced and the capacitance between the drain and source ($C_{ds}$) may be reduced, thus improve the signal distortion of the device. In addition, by providing back-gate structures with different work function, the RF switch can also have different electrical switching performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a buried dielectric layer;
a first gate structure, disposed on a front-side of the buried dielectric layer;
a second gate structure, disposed on a backside of the buried dielectric layer;
a first source/drain region and a second source/drain region, disposed between the first gate structure and the second gate structure;
a trench, formed in the buried dielectric layer; and
a contact layer, disposed in the trench and electrically coupled to the second source/drain region, wherein the contact layer and the second gate structure are formed of the same material.

2. The semiconductor device of claim 1, wherein the contact layer is in direct contact with the second source/drain region.

3. The semiconductor device of claim 1, wherein the second gate structure is in direct contact with the buried dielectric layer.

4. The semiconductor device of claim 1, wherein the second gate structure is laterally spaced apart from the contact layer.

5. The semiconductor device of claim 1, wherein a top surface of the second gate structure is higher than a top surface of the contact layer.

6. The semiconductor device of claim 1, wherein the first source/drain region and the second source/drain region are disposed on the front-side of the buried dielectric layer.

7. The semiconductor device of claim 1, further comprising a front-side interconnection disposed on the front-side of the buried dielectric layer and electrically coupled to the first gate structure.

8. The semiconductor device of claim 1, further comprising a first gate contact structure disposed on the front-side of the buried dielectric layer and electrically coupled to the first gate structure.

9. The semiconductor device of claim 1, further comprising a second gate contact structure disposed on the backside of the buried dielectric layer and electrically coupled to the second gate structure.

10. The semiconductor device of claim 1, further comprising:
a first contact structure, disposed on the front-side of the buried dielectric layer and electrically coupled to the first source/drain region; and
a second contact structure, disposed on the backside of the buried dielectric layer and at a backside of the second source/drain region, wherein the second contact structure is electrically coupled to the second source/drain region.

11. The semiconductor device of claim 1, further comprising:
an interlayer dielectric, disposed on the backside of the buried dielectric layer and covering the second gate structure; and
a plurality of conductive patterned features, are disposed along the surface of the interlayer dielectric, wherein the conductive patterned features are electrically coupled to the second gate structure, the first source/drain region and the second source/drain region respectively.

12. The semiconductor device of claim 11, wherein the conductive patterned features are separated from one another.

* * * * *